(12) United States Patent
Aghtar (10) Patent No.: US 7,423,458 B2
(45) Date of Patent: Sep. 9, 2008

(54) MULTIPLE SAMPLING SAMPLE AND HOLD ARCHITECTURES

(75) Inventor: Saeed Aghtar, Hillsborough, NJ (US)

(73) Assignee: Analog Devices, Inc., Norwood, MA (US)

(*) Notice: Subject to any disclaimer, the term of this patent is extended or adjusted under 35 U.S.C. 154(b) by 58 days.

(21) Appl. No.: 11/371,136

(22) Filed: Mar. 8, 2006

(65) Prior Publication Data
US 2007/0210835 A1   Sep. 13, 2007

(51) Int. Cl.
*H03K 5/00* (2006.01)
(52) U.S. Cl. .................. 327/91; 327/337; 327/554; 327/94; 327/96
(58) Field of Classification Search .................. None
See application file for complete search history.

(56) References Cited

U.S. PATENT DOCUMENTS

| | | | | |
|---|---|---|---|---|
| 4,962,325 | A * | 10/1990 | Miller et al. | 327/95 |
| 5,698,999 | A * | 12/1997 | Etoh et al. | 327/94 |
| 5,703,506 | A * | 12/1997 | Shook et al. | 327/87 |
| 6,169,427 | B1 * | 1/2001 | Brandt | 327/94 |
| 6,570,410 | B2 * | 5/2003 | Manganaro | 327/94 |

FOREIGN PATENT DOCUMENTS

JP   2004152329   5/2004

OTHER PUBLICATIONS

Waltari et al., "A 10-Bit 220-MSample/s CMOS Sample-and-Hold Circuit" Electronic Circuit Design Laboratory, Helsinki University of Technology, 1998, pp. 1253-1256.

* cited by examiner

*Primary Examiner*—Tuan T. Lam
*Assistant Examiner*—Hiep Nguyen
(74) *Attorney, Agent, or Firm*—Gauthier & Connors LLP (57) ABSTRACT

A sample and hold circuit architecture samples using two capacitors that are cyclically switched between charge and discharge modes. The sample and hold circuit includes a buffer to receive an input signal to be sampled, a first sampling capacitor, a second sampling capacitor, and an amplifier. The first sampling capacitor is connected to the output of the buffer during the positive phase of a clock and across the feedback path of the amplifier during the zero phase of the clock. The second sampling capacitor is connected to the output of the buffer during the zero phase of the clock and across the feedback path of the amplifier during the positive phase of the clock. Neither the first sampling capacitor nor the second sampling capacitor is simultaneously connected to the buffer, the amplifier, or to each other.

9 Claims, 13 Drawing Sheets

MULTIPLE SAMPLING SAMPLE AND HOLD ARCHITECTURES

BACKGROUND AND SUMMARY

Many modern electronic devices operate with one or more inputs as analog (continuously variable) signals. Since it is becoming more common for these devices to be digital in nature, it is necessary at some point to convert the analog signal to a sampled digital signal. A key part of this analog to digital conversion process is a sample and hold circuit.

The sample and hold circuit is placed ahead of the circuit element or elements that do the actual conversion to digital values. Because the conversion takes a finite amount of time, it is necessary to provide the converter circuit with a stable, fixed, signal for the duration of the sampling time. The sample and hold circuit is the element that performs this operation. The sample and hold circuit consists of some sort of element that can sample the input signal for a short period of time, corresponding to the conversion time, and then provide this sampled value to the actual converter circuitry. The sample and hold may simply take a brief sample of the input signal or it may average the input signal over the sampling interval.

Figure 1:
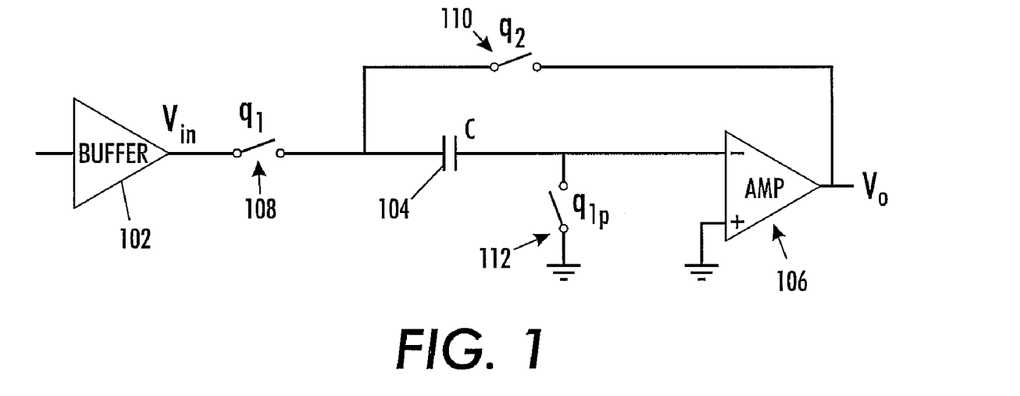
FIG. 1 illustrates the architecture of a sample and hold circuit.

FIG. 1 shows a conventional sample-and-hold architecture, referred to as a single-sampling architecture. The circuit comprises a buffer amplifier 102 that serves to buffer the input signal, a sampling capacitor 104, an output amplifier 106, and three switches (108, 110, and 112). The switches (108, 110, and 112) are controlled by a series of clock signals (120, 122, 124, and 126), shown in FIG. 2. For ease of understanding, a clock signal (122, 124, and 126) has been associated with each switch of FIG. 1. The switches (108, 110, and 112) operate so that the switches (108, 110, and 112) are closed whenever the associated clock signal is high and are opened when the associated clock signal is low.

Figure 2:
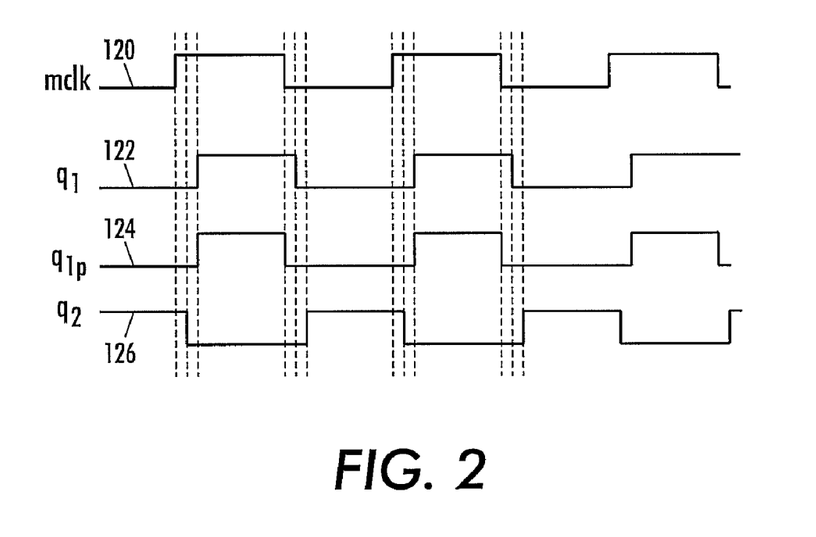
FIG. 2 illustrates the set of clock signals used with the architecture of a sample and hold circuit of FIG. 1.

In the first half cycle of the main clock signal 120, switch 110 is opened when clock signal q2 goes low. Switches 108 and 112 are then closed as clock q1 and q1p go high. Therefore, the capacitor C is connected to the output of buffer 102 and will charge to the voltage of the output of buffer 102 (tracking mode). At the end of the tracking mode, switch 112 is opened when clock signal q1p goes low, and then switch 108 is opened when clock signal q1 goes low. Finally switch 110 is closed when clock signal q2 goes high, placing the capacitor C in a feedback path between the output of amplifier 106 and the input of amplifier 106. This will cause the output of the amplifier 106 to swing to the voltage of the capacitor C. This voltage is held at the amplifier 106 output for half cycle of the main clock signal (hold mode).

The sample and hold output provides samples of the output of buffer 102 every clock cycle ($T_{mclk}$). However, due to the lack of overlapping between tracking and hold modes, the buffer 102 and the sample and hold outputs have only half a clock cycle ($T_{mclk}/2$) to settle. The buffer 102 and the sample and hold outputs are idle in the other half clock cycle.

A shorter available settling time requires a higher power consumption to achieve a given distortion level. This is because the time it takes a capacitor to charge to the buffer voltage is dependent on the current capacity of the buffer amplifier. Similarly, the time it takes the output amplifier to charge up to the voltage held on the capacitor is dependent on the current capacity of the output amplifier. The higher the current capacity, the more power the amplifiers consume. In order to achieve high accuracy in the tracking of the output of the amplifier to the input, shorter settling times are desirable. Therefore, the idle times of one half of a clock signal cycle in each of the tracking and hold modes require higher power consumption.

It would therefore be desirable to provide an alternative sample and hold architecture that utilized idle times and lowered the requirement for power consumption in the buffer and output amplifiers.

A first aspect of the present invention is a sample and hold circuit. The sample and hold circuit includes a buffer to receive an input signal to be sampled; an amplifier to output the sampled signal; a first sampling capacitor operatively connected between the buffer and the amplifier; a second sampling capacitor operatively connected between the buffer and the amplifier; a first set of switches to connect the first sampling capacitor to an output of the buffer during a positive phase of a clock and to connect the first sampling capacitor across a feedback path of an amplifier during a zero phase of the clock; and a second set of switches to connect the second sampling capacitor to the output of the buffer during the zero phase of the clock and to connect the second sampling capacitor across the feedback path of the amplifier during the positive phase of the clock.

BRIEF DESCRIPTION OF THE DRAWING

The drawings are only for purposes of illustrating various embodiments and are not to be construed as limiting, wherein.

DETAILED DESCRIPTION

For a general understanding, reference is made to the drawings. In the drawings, like references have been used throughout to designate identical or equivalent elements. It is also noted that the drawings may not have been drawn to scale and that certain regions may have been purposely drawn disproportionately so that the features and concepts could be properly illustrated.

A sample and hold circuit uses two capacitors, charging one for a full cycle, while the other is connected to an output of an amplifier, and then switching the roles of the two capacitors. This allows a full cycle to charge the capacitor and hence reduce the current capability and hence power requirements by a factor of 2.

Figure 3:
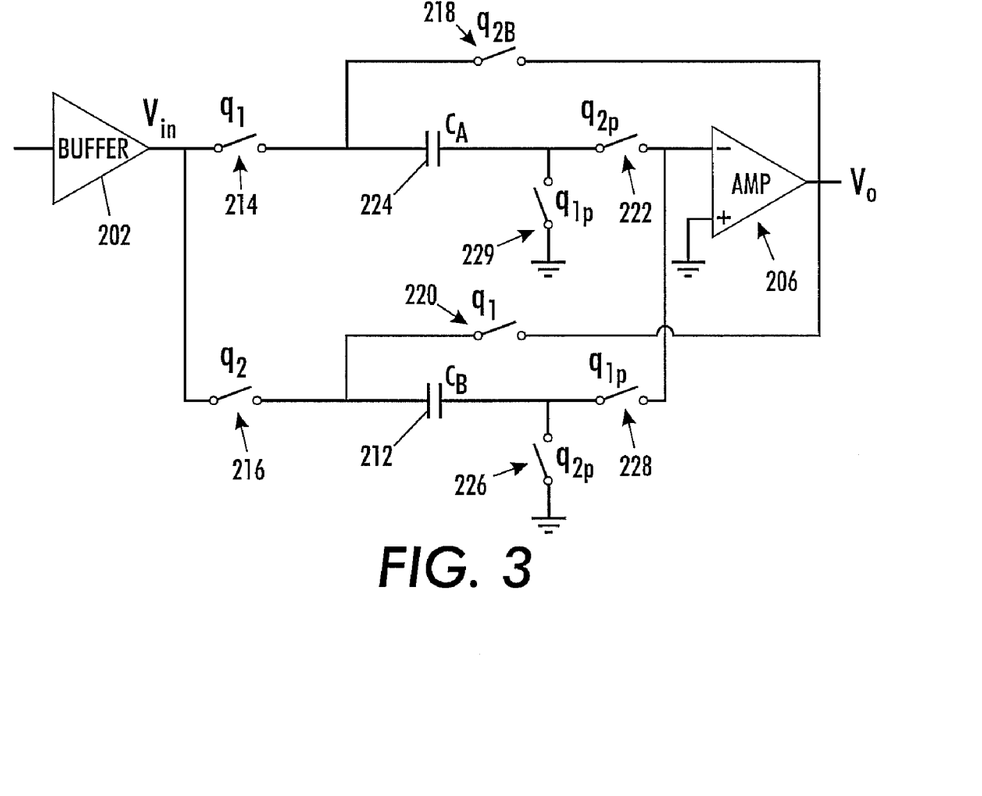
FIG. 3 shows a double sampling sample and hold circuit architecture.

FIG. 3 illustrates sample and hold architecture using two sampling capacitors. The circuit contains a buffer 202 and a charge amp 206. The circuit also contains two charging capacitors 224 and 212 and switches 214, 216, 218, 220, 222, 226, 228, and 229.

Figure 4:
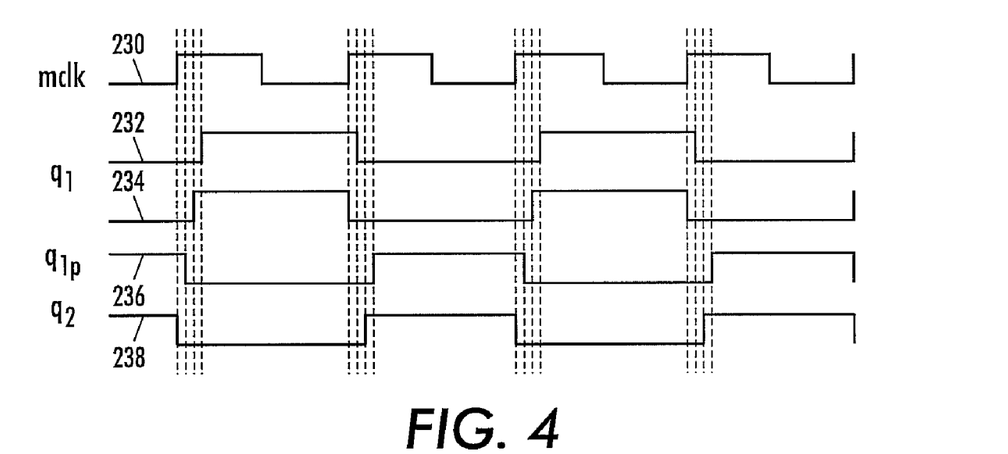
FIG. 4 illustrates the set of clock signals used with the double sampling sample and hold circuit architecture of FIG. 3.

These switches are controlled by a series of clock signals shown in FIG. 4. Each clock signal has been associated with a switch of FIG. 3. It is noted that the signals that control the switches may be logical operations of one or more of the clock signals. For example, the signal controlling a switch may be a logical OR of two clock signals.

The clock signals ensure that the switches close in the proper order. Slight delays between the rising edges of the four clock signals 232, 234, 236, and 238 are chosen to ensure that the capacitors (224 and 212) are connected to either the buffer 202 or the amplifier 206 at any given time, but not to both. It is noted that there is no interaction between the two capacitors 224 and 212. These four clock signals are all derived from the master clock signal 230.

The operation of the circuit is similar to that of the single capacitor sample and hold. At the start of the cycle, clock signals 236 and 238 are high and all other clock signals are low. When clock signal 238 goes low, switches 226 and 222 open. This disconnects capacitor 212 from ground and capacitor 224 from the inverting input of amplifier 206.

The next step in the cycle occurs when clock signal 236 goes low. At this time, switches 216 and 218 open. The next step in the cycle occurs when clock signal 234 goes high. At this time, switches 228 and 229 close. One end of capacitor 224 is now grounded and one end of capacitor 212 is connected to the inverting input of the amplifier 206.

At the last step, clock signal 232 goes high. This causes switches 214 and 220 to close. Capacitor 224 is now connected to the buffer 202 and begins to charge to the voltage at the output of the buffer 202. Capacitor 212 is connected between the output and the input of the amplifier 206. The amplifier 206 begins to swing its output to match the voltage stored on the capacitor 212 during the last clock signal cycle when it was charging.

Figure 5:
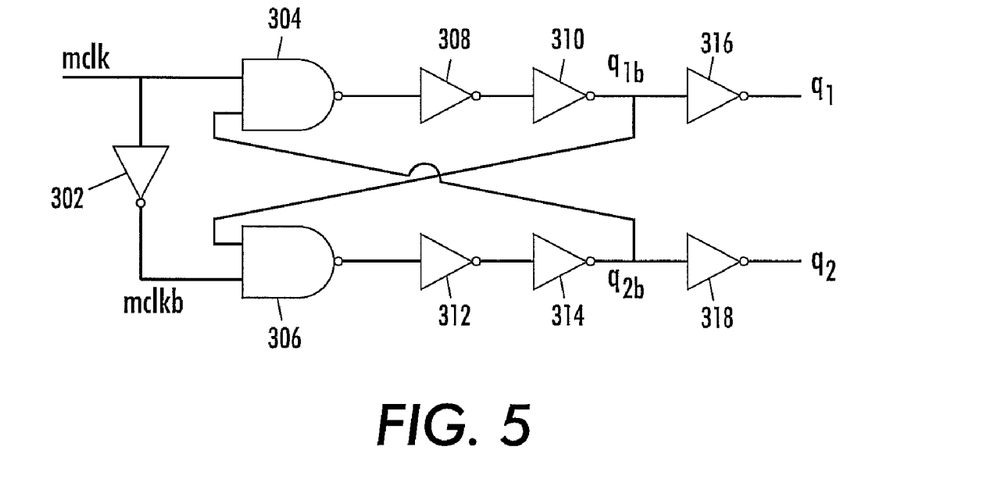
FIG. 5 shows a circuit to generate the clock signals for the circuit of FIG. 3.

FIG. 5 shows a circuit for generating the sequential non-overlapping clock signals that are necessary to ensure proper operation of the circuit in FIG. 3. NAND gates 304 and 306 form a cross coupled R-S flip-flop. One input to gate 304 is the master clock signal mclk and one input to gate 306 is the master clock signal mclk which has been inverted by inverted 302.

Figure 6:
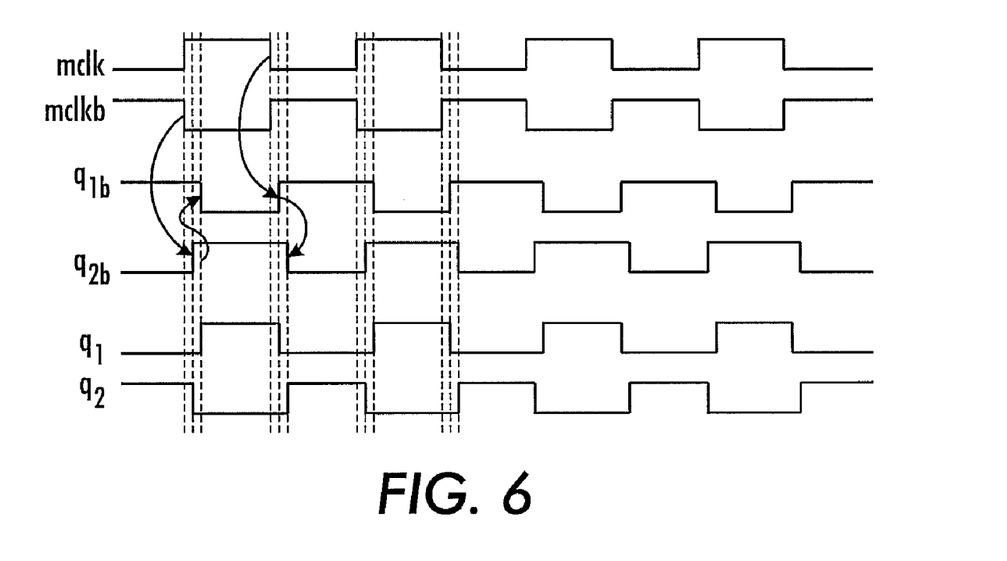
FIG. 6 illustrates the set of clock signals generated by the circuit of FIG. 5.

The output of gate 304 is passed through inverters 308 and 310 while the output of gate 306 is passed through inverters 312 and 314. The only purpose of the double inverters is to introduce a small delay due to the propagation of signals through the inverters. The output of inverter 310 is connected back to the second input of gate 306 and also through inverter 316. The output of inverter 314 is passed back to the second input of gate 304 and through inverter 318. The relationship between the signals from inverters 310, 316, 314, and 318 and the clock signals are illustrated in FIG. 6.

The double sampling circuit of FIG. 3 has an advantage over the conventional single sampling circuit of FIG. 1 because of the double capacitor arrangement both the buffer and output amplifier have a full clock signal cycle to settle. This reduces the current demands on these amplifiers by a factor of 2, thereby reducing their power requirements.

However the double sampling circuit of FIG. 3 is not without its own problems. In particular, because the capacitors remain charged to whatever voltage was on the capacitors. When the capacitors switch between the output amplifier and the buffer, the amount of charge that must be transferred during the next sampling depends on whatever was left on the capacitor during the previous sample.

It is noted that for input frequencies below the Nyquist rate, the average difference between the buffer output and the previous sample at the start of the tracking mode is larger in the double sampling architecture. This difference results in a larger disturbance at the buffer output which can result in a deterioration of the settling behavior at the output of both the buffer and the circuit as a whole.

One way to eliminate the above defect in the double sampling architecture is to ensure that the capacitor is in some standard state before reconnecting it to the buffer. This will ensure uniform behavior of the charging phase regardless of the state of the capacitor during the previous cycle. In order to accomplish this, the double sampling architecture is extended to include a third phase where the capacitor is discharged to a fixed value before being recharged. This will involve three phases: charge, sample, discharge.

Figure 7:
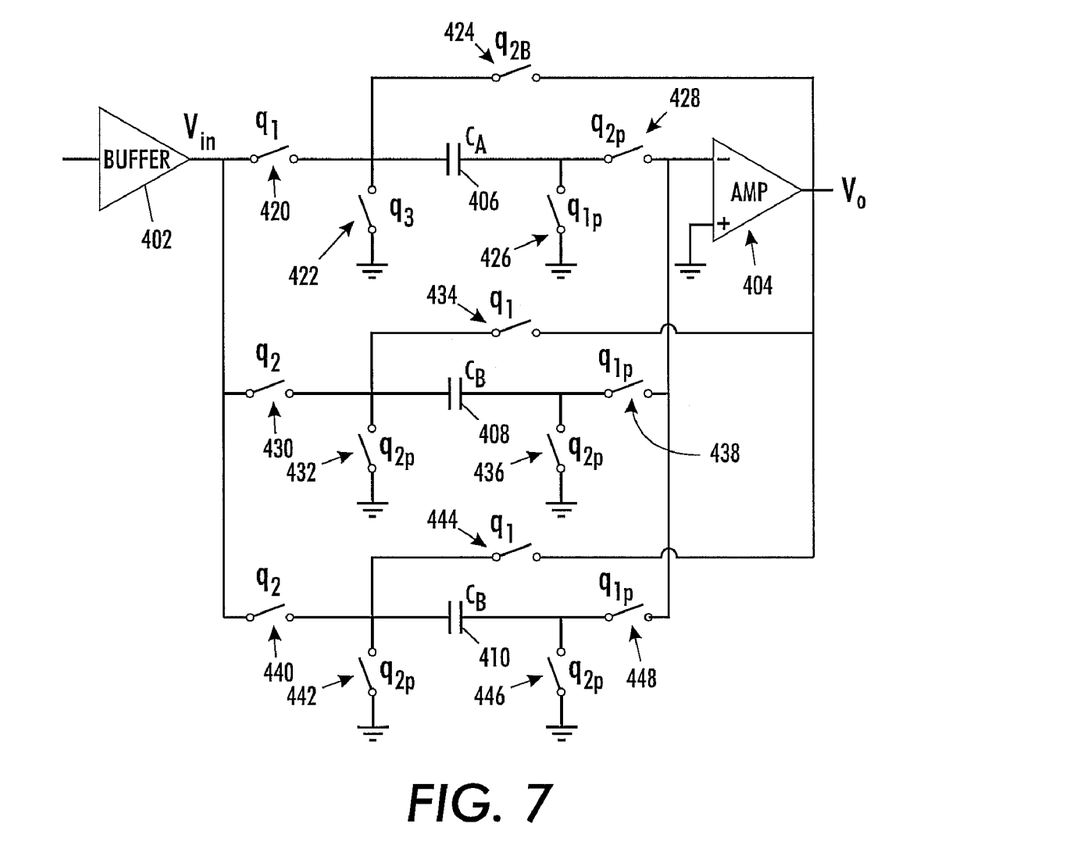
FIG. 7 shows a triple sampling sample and hold circuit architecture.
Figure 8:
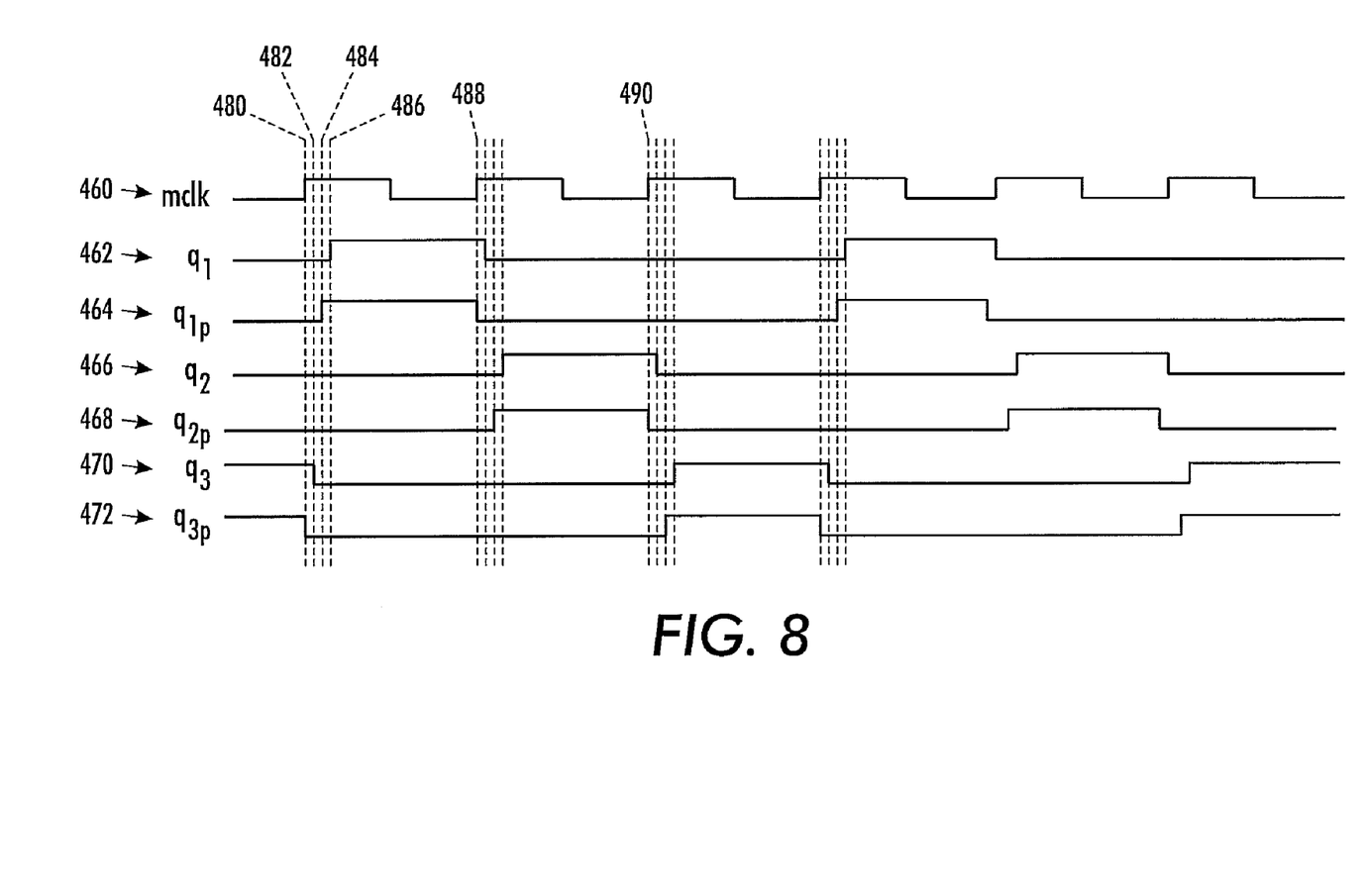
FIG. 8 illustrates the clock signals used with the triple sampling sample and hold circuit architecture of FIG. 7.

FIG. 7 shows a schematic of a triple sampling architecture that implements such a scheme. There are now three capacitors and associated switches. FIG. 8 shows the set of clock signals used to control the switching of the three capacitors between the three phases of operation of the circuit. Again, for clarity, each clock signal has been associated with a switch of FIG. 7. For some of the switches, more than one clock signal can control the switch. For these switches, both clock signals are indicated with a "+" sign between the clock signals to indicate a logical OR of the clock signal.

The operation of the circuit of FIG. 7 is similar to that of the double sampling architecture of FIG. 3. The set of clock signals and switches ensures that each capacitor is in turn first connected to the output of the buffer, then across the feedback path of the output amplifier, and then discharged to ground. The non-overlapping clock signals also ensure that the capacitors are never connected to each other or to both the buffer and the output amplifier at the same time.

Referring to FIG. 7, at the start, clock signals 470 and 472 are high so switches 422, 426, 434, 438, 440, and 446 are closed (and all other switches are open) so that capacitor 406 is grounded at both ends, capacitor 408 is connected between the output and the inverting input of amplifier 404 thus causing the output amplifier's output terminal to be at whatever voltage capacitor 408 was previously charged to, and capacitor 410 is connected to the buffer 402 and has charged up to the voltage at the buffer output.

The cycle begins at time 480 when clock signal 472 goes low. This transition causes switches 438 and 446 to open. This disconnects capacitor 408 from the inverting input of the output amplifier 404 and disconnects one end of capacitor 410 from ground, stopping capacitor 410 from charging further.

The next step occurs at time 482 when clock signal 470 goes low. This opens switches 422, 426, 434, and 440. When switches 422 and 426 open, the switches 422 and 426 leave capacitor 406 floating. The opening of switch 434 completes the disconnection of capacitor 408 from the amplifier 404. The opening of switch 440 disconnects capacitor 410 from the output of the buffer 402. At this stage all three capacitors are not connected to anything.

The next step occurs when clock signal 464 goes high at time 484 causing switches 426 and 448 to close. This connects one end of capacitor 406 to ground and one end of capacitor 410 to the inverting input of the output amplifier. The cycle is completed when clock signal 462 goes high. This closes switches 420, 432, 436, and 444. When switch 420 closes, switch 420 connects capacitor 406 to the buffer 402, causing it to start charging to the voltage at the output of the buffer. The closing of switches 432 and 436 grounds both ends of capacitor 408 causing it to discharge. When switch 444 closes, switch 444 connects the other end of capacitor 410 to the output terminal of output amplifier 404. This leaves capacitor 410 connected between the output terminal of output amplifier 404 and its inverting input, causing the output terminal of the amplifier to swing to the voltage stored on capacitor 410 during the previous cycle. The circuit now remains in this state during the remainder of this cycle of the master clock signal 460.

The effect is to cause a rotation of the roles of the three capacitors. Just prior to the start of the cycle described above capacitor 406 was grounded at both ends, capacitor 408 was connected across the output amplifier 404, and capacitor 410 was being charged to the output voltage of the buffer amplifier 402. After the cycle is completed at time 486, capacitor 406 is now being charged, capacitor 408 is now grounded at both ends and is discharging, and capacitor 410 is connected across the output amplifier 404 thus setting the output voltage of the circuit.

At time 488, a similar interchange of roles takes place. This time the effect is to leave capacitor 406 connected across the output amplifier, capacitor 408 charging, and capacitor 410 grounded and discharging.

At time 490, a third interchange of roles takes place. This time the effect is to leave capacitor 406 grounded and discharging, capacitor 408 connected across the output amplifier, and capacitor 410 connected to the buffer and being charged. Thus, after three cycles, the same configuration is realized as when the process started at time 480. The cyclic succession of role switching continues; each capacitor in turn is charged, then used to set the sample output, then discharged.

Figure 9:
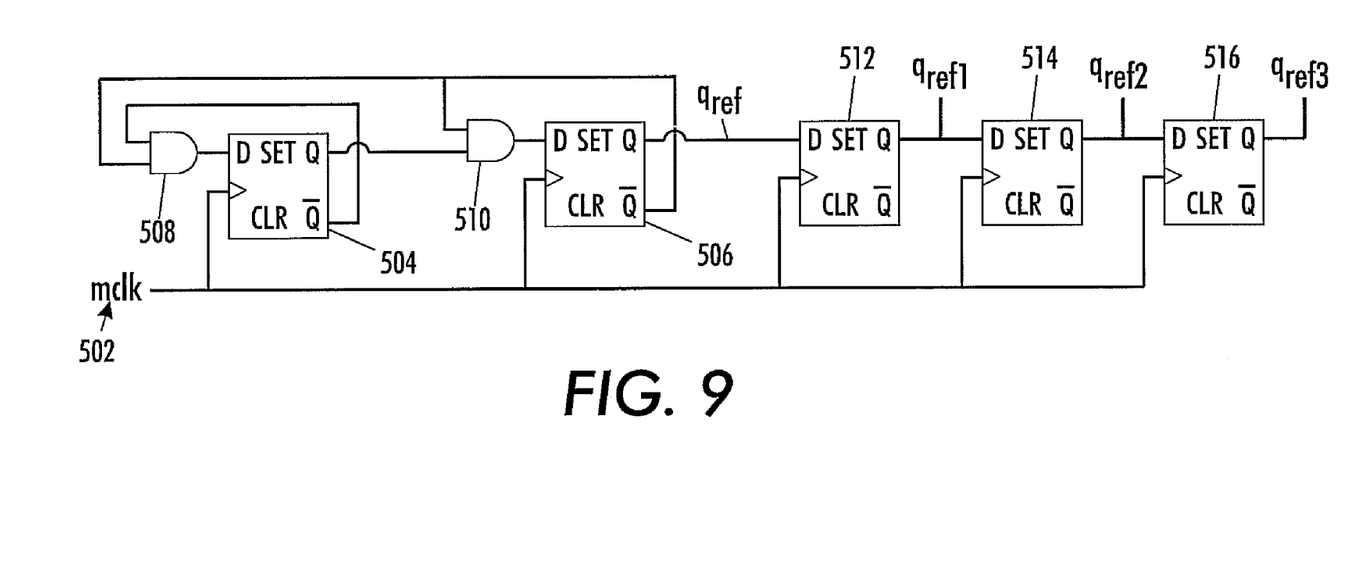
FIGS. 9 and 10 show circuits used to generate the clock signals for the circuit of FIG. 7.
Figure 11:
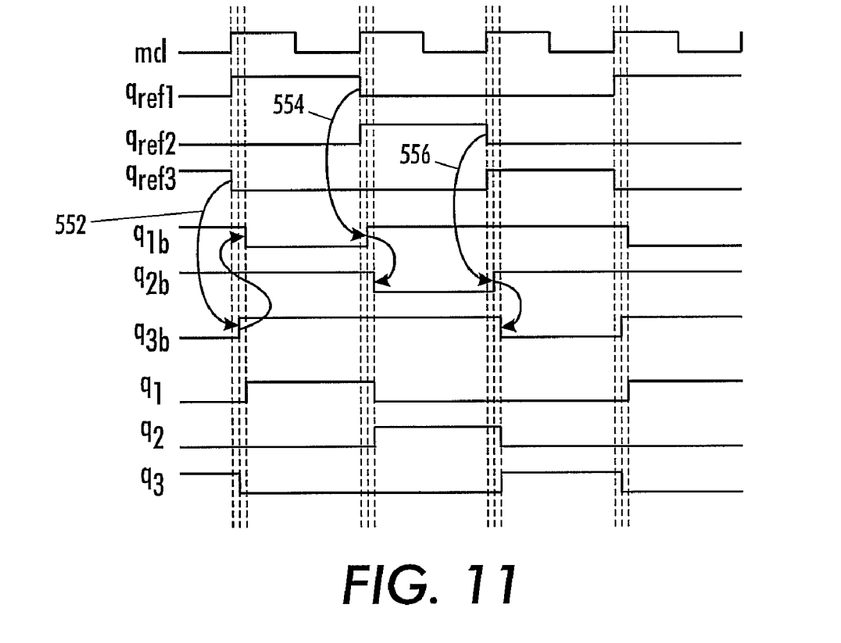
FIG. 11 illustrates the set of clock signals generated by the circuits of FIGS. 9 and 10.

FIG. 9 shows a circuit that will generate the offset clock signals needed for the triple sampling sample and hold architecture shown in FIG. 7. The master clock signal 502 is fed to the trigger input of a pair of D flip-flops 504 and 506. The data input of these two flip-flops are connected to the outputs of the two flip-flops using AND gates 508 and 510. The effect is to generate a clock signal $q_{ref}$ at the Q output of flip-flop 506 that is active for an entire cycle of the master clock signal, but only every third cycle. A signal $q_{ref}$ is fed to the D input of the first D flip-flops 512. The Q output of flip-flop 512 is connected to the D input of flip-flop 514, and the Q output of flip-flop 514 is connected to the D input of flip-flop 516. The effect is that the three Q outputs are each active for a full cycle of the master clock signal, but each output is displaced by one full clock signal cycle. This is shown by traces 552, 554 and 556 of FIG. 11.

Figure 10:
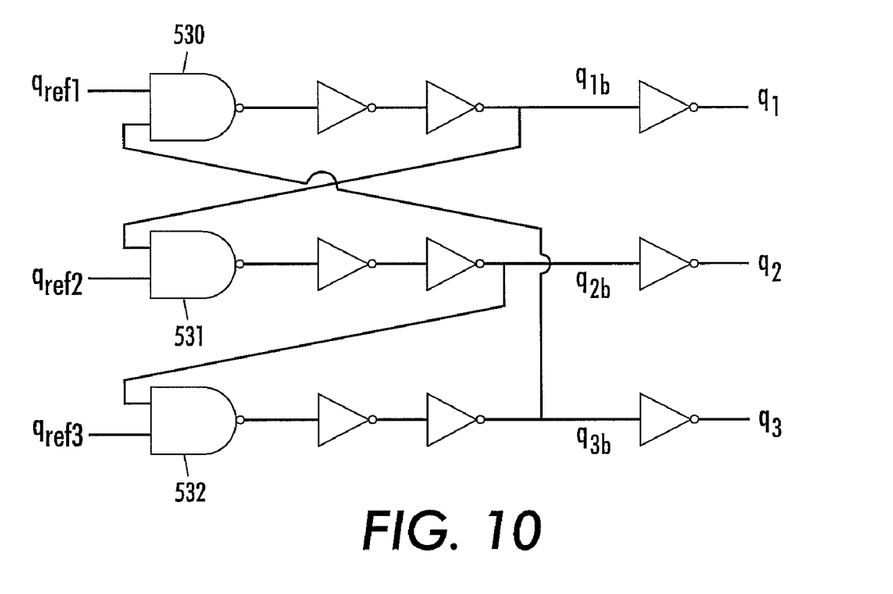

The three time-shifted clock signals of FIG. 9 are fed to the inputs of three cross connected NAND gates 530, 531, and 532 of FIG. 10. The outputs of the three NAND gates 530, 531, and 532 are fed through a pair of inverters, and the output of the second inverter is fed back to the other input of one of the three NAND gates. The circuit operation is otherwise the same as the double sampling clock signal circuit shown in FIG. 5 except that there are three sets of slightly offset clock signals instead of two.

The advantage of the triple sampling architecture over the double sampling architecture can be shown by the following analysis of the level of the disturbance at the buffer output due to the switching of the capacitors. The disturbance to the buffer output at the beginning of the tracking mode depends on the difference between the buffer output voltage and the initial voltage of the sampling capacitor at the start of the tracking phase.

In the conventional (single-sampling) flip-around architecture, this voltage difference is equal to the input signal variation during half a clock signal cycle ($T_{mclk}/2$) defined as $$Y_S[nT_S] = X[nT_S] - X[(n-1/2)T_S], \quad (1)$$

where $Y_S$ is the voltage difference for the single sampling architecture, X is the buffer output voltage, and $T_S = T_{mclk}$ is the sampling period.

In the double-sampling architecture, the difference between the buffer output voltage and the initial capacitor voltage at the beginning of the tracking mode is equal to the input signal variation during one clock signal cycle ($T_S$). It is noted that it takes one clock signal cycle for each capacitor to reconnect to the buffer output. Therefore, the voltage difference can be calculated as $$Y_D[nT_S] = X[nT_S] - X[(n-1)T_S] \quad (2)$$

In the triple-sampling architecture, the sampling capacitor is discharged at the beginning of the tracking mode. Therefore, the difference between the buffer output voltage and the capacitor initial voltage, $Y_T$ is given by $$Y_T[nT_S] = X[nT_S]. \quad (3)$$

For a single tone input signal $X(t) = A \cdot \sin(\omega_0 t)$ $$Y_S = A \cdot (\sin[\omega_0 nT_S] - \sin[\omega_0(n-1/2)T_S]) \quad (4)$$
$$= 2A \cdot \sin\left(\frac{\omega_0 T_S}{4}\right) \cdot \cos[\omega_0(n-1/4)T_S]$$

$$Y_D = A \cdot (\sin[\omega_0 nT_S] - \sin[\omega_0(n-1)T_S]) \quad (5)$$
$$= 2A \cdot \sin\left(\frac{\omega_0 T_S}{2}\right) \cdot \cos[\omega_0(n-1/2)T_S]$$

$$Y_T = A \cdot \sin[\omega_0 nT_S] = A \cdot \cos[\omega_0 nT_S - \pi/2]. \quad (6)$$

The average of absolute values of the voltage differences over N samples is given by $$Y_{S,Ave} = \frac{1}{N}\sum_{n=1}^{N}|Y_S| \quad (7)$$
$$= \left|2A \cdot \sin\left(\frac{\omega_0 T_S}{4}\right)\right| \cdot \frac{1}{N}\sum_{n=1}^{N}|\cos[\omega_0(n-1/4)T_S]|$$

$$Y_{D,Ave} = \frac{1}{N}\sum_{n=1}^{N}|Y_D| \quad (8)$$
$$= \left|2A \cdot \sin\left(\frac{\omega_0 T_S}{2}\right)\right| \cdot \frac{1}{N}\sum_{n=1}^{N}|\cos[\omega_0(n-1/2)T_S]|$$

$$Y_{T,Ave} = \frac{1}{N}\sum_{n=1}^{N}|Y_T| = |A| \cdot \frac{1}{N}\sum_{n=1}^{N}|\cos[\omega_0 nT_S - \pi/2]| \quad (9)$$

Figure 12:
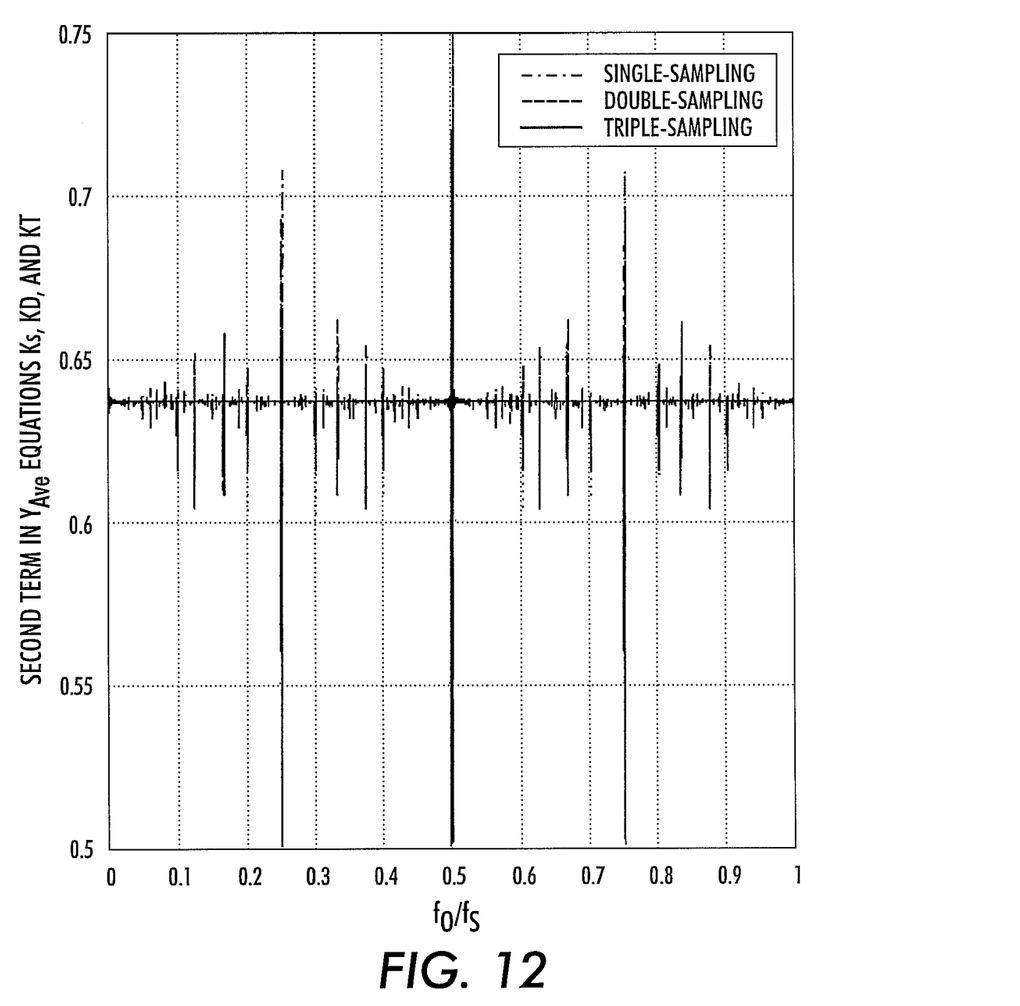
FIG. 12 shows a graph of the level of sampling distortion as a function of the sampling frequency.

FIG. 12 shows the value of the summation terms in Equations (7) to (9) defined as $$K_S = \frac{1}{N}\sum_{n=1}^{N}|\cos[\omega_0(n-1/4)T_S]|, \quad (10)$$

$$K_D = \frac{1}{N}\sum_{n=1}^{N}|\cos[\omega_0(n-1/2)T_S]|, \quad (11)$$

$$K_T = \frac{1}{N}\sum_{n=1}^{N}|\cos[\omega_0 nT_S - \pi/2]|. \quad (12)$$

As can be seen, above terms are equal ($K_S = K_D = K_T = K_0$) at most frequencies of interest ($f_0 < f_S$). Therefore, the values of $Y_{S,Ave}$, $Y_{D,Ave}$, and $Y_{T,Ave}$ can be given by $$Y_{S,Ave} = 2A \cdot \mathrm{Sin}\left(\frac{\omega_0 T_S}{4}\right) \cdot K_0, \quad (13)$$

$$Y_{D,Ave} = 2A \cdot \mathrm{Sin}\left(\frac{\omega_0 T_S}{4}\right) K_0, \quad (14)$$

$$Y_{T,Ave} = A \cdot K_0. \quad (15)$$

Figure 13:
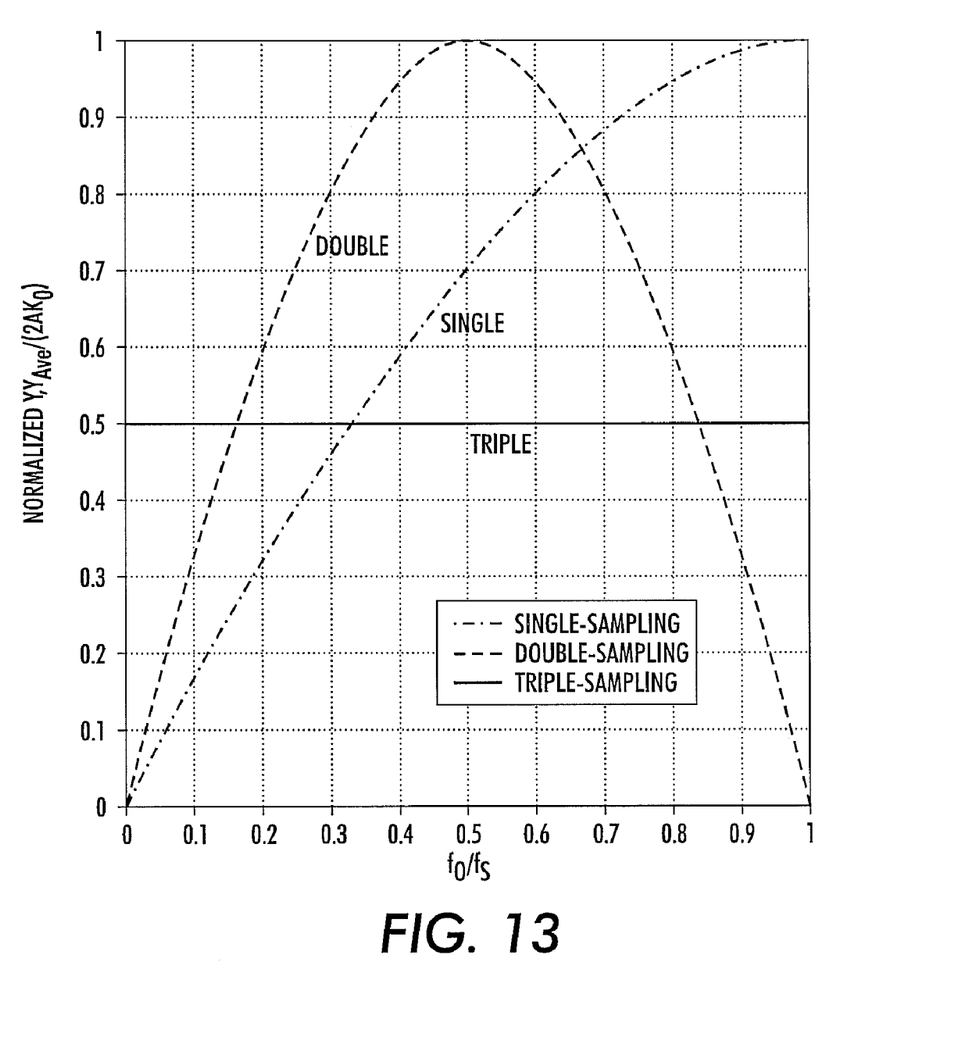
FIG. 13 shows a graph comparing the relative distortion for the single, double, and triple sampling architectures.

The normalized values of the $Y_{Ave}$ in Equations (13) to (15) are shown in FIG. 13. The higher the value, the larger is the difference between the buffer output and the sampling capacitor voltage at the beginning of the tracking period. Therefore, a larger value corresponds to more undesired disturbance to the buffer output. As can be seen, at higher frequencies where the distortion tends to be worse, the triple-sampling architecture provides less difference between the buffer output voltage and the sampling capacitor voltage at the beginning of the tracking period. This results in a lower disturbance introduced at the buffer output and faster settling. If sampling capacitors are connected to the buffer output during the discharge mode the triple-sampling architecture will provide even lower disturbance. In an ideal case when the resistance is zero, the line for triple sampling in FIG. 13 moves from 0.5 to zero. It is also noted that the double sampling is significantly worse than the other two architectures in most of the signal frequencies.

One further improvement can be added to the triple sampling architecture to reduce distortion. Instead of grounding the capacitors after they have been in the hold phase, it is possible to pre-charge them to a fixed value. In particular they can be connected through a resistance to the output of the buffer. The resistance will limit the loading on the buffer and increase the time needed for the capacitor to charge to the buffer voltage, but will leave the capacitor charged to a value much closer to the buffer output at the time the capacitor is switched from discharge mode to charge mode.

Figure 14:
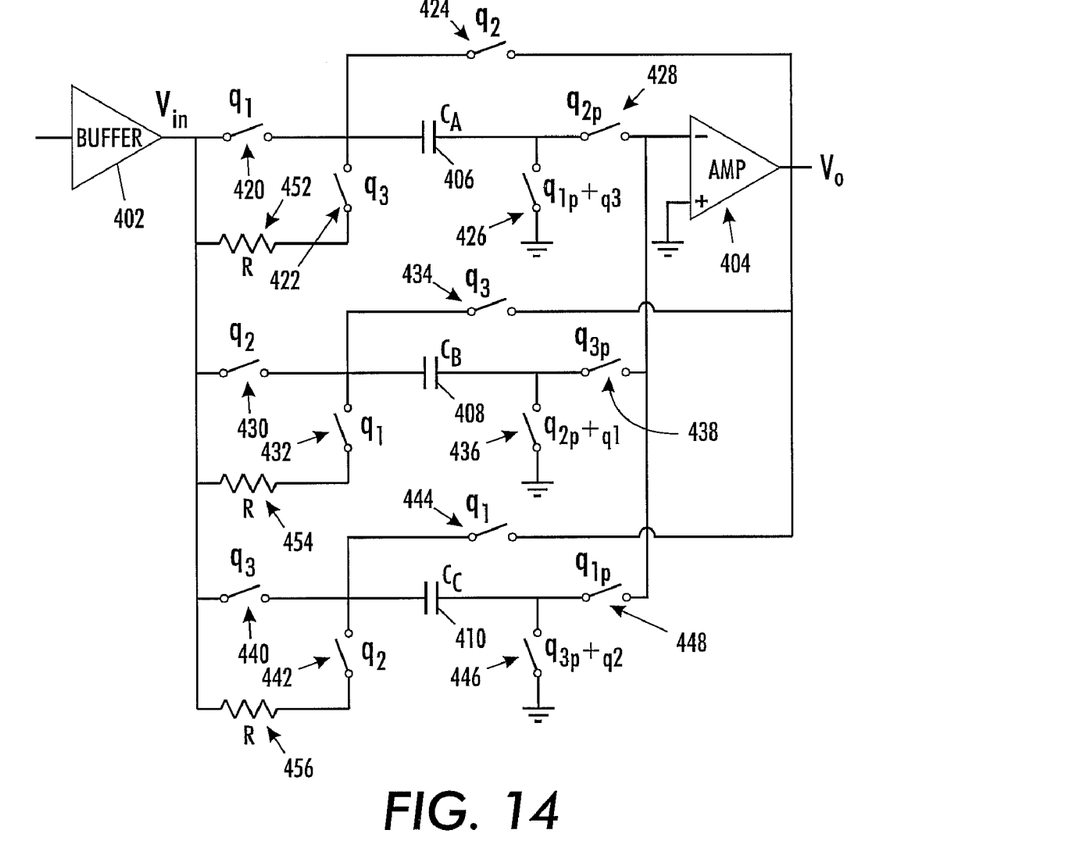
FIG. 14 shows a triple sampling sample and hold circuit architecture with pre-charged sampling capacitors.

FIG. 14 shows a modification to the circuit of FIG. 7. The only change is that switches 422, 432, and 442 are now returned through resistors 452, 454, and 456 to the output of the buffer amplifier. By choosing a resistance value so that the RC time constant is about equal to the period of the clock signal, a sufficient charge is realized to significantly reduce the distortion.

The above architectures have illustrated the circuit configuration where both the buffer and the sample and hold are single ended, with one input of either amplifier connected to ground. It is also desirable in some circumstances to run the circuit in double-ended or balanced mode where the signals are input as a differential pair. The circuit architecture is naturally extended to the double-ended configuration, where each capacitor is replaced by a pair of capacitors, one for each leg of the circuit.

Figure 15:
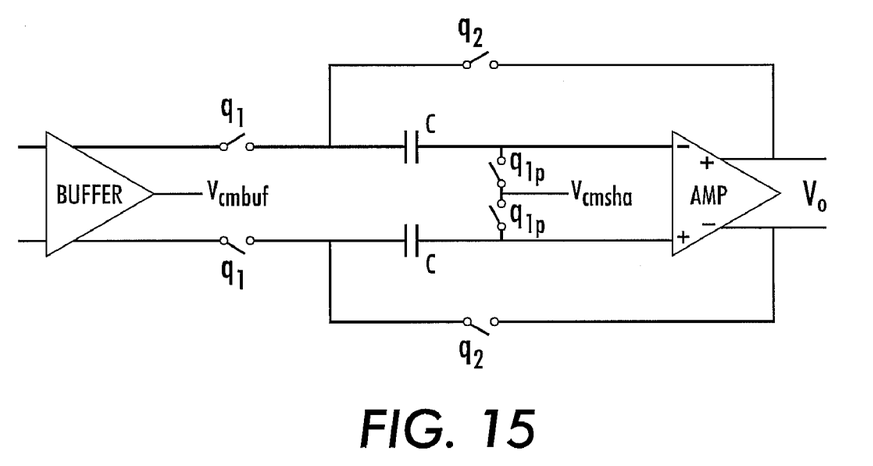
FIG. 15 shows a differential version of the conventional single sampling architecture.

FIG. 15 shows a double ended version of the single sampling architecture shown in FIG. 1. The circuit and clock signal arrangement is almost identical except that there are two capacitors, one in each leg of the circuit, and the capacitors are not returned to ground, but to the common mode voltage of the output amplifier. A differential version of the triple sampling architecture can be derived from FIG. 7 or FIG. 14.

If there is a difference between the common mode voltage of the buffer and the common mode voltage of the output amplifier, there is an additional distortion introduced into the output. In particular, if the common mode voltage of the buffer is higher than the common mode voltage of the sample and hold, the sample and hold input drops by the difference between the common mode voltages during the hold phase. The low bias voltage of the amplifier may become negative during the voltage jump at the start of the hold phase. These jumps occur due to the finite response speed of the sample and hold. This negative voltage can partially forward bias the bulk-drain/source of the switches and hence inject current into the sampling capacitors that changes the capacitor charge during the hold mode. These voltage jumps are signal dependent since the voltage jumps depend on the amplitude of the samples.

The distortion introduced by this effect can be minimized by connecting the sampling capacitors to the common mode voltage of the buffer rather than the common mode voltage of the sample and hold.

Figure 16:
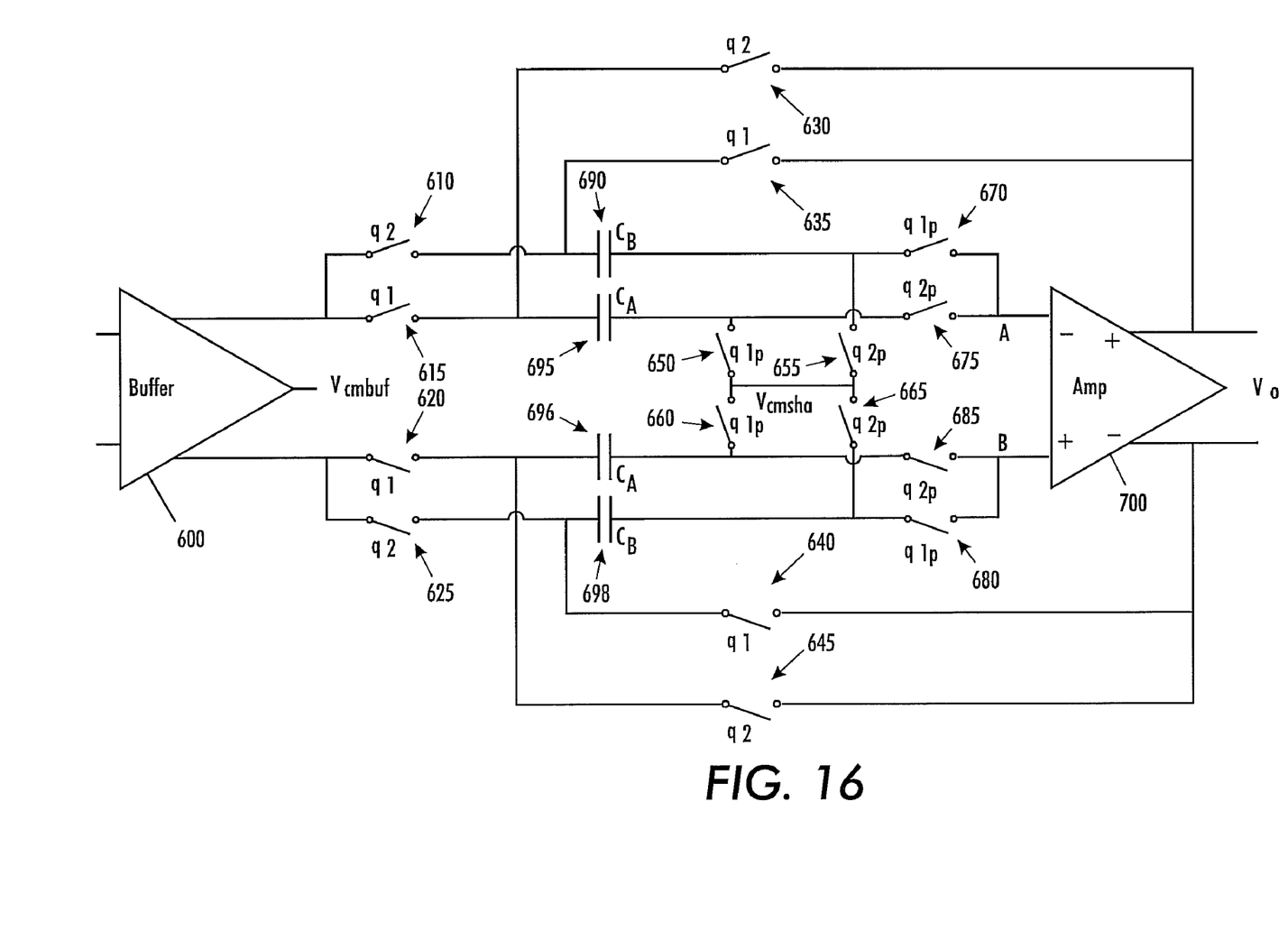
FIG. 16 illustrates a differential version of the double-sampling flip-around sample and hold circuit.

FIG. 16 illustrates the differential version of the double sampling flip-around sample and hold architecture. The circuit contains a buffer 600 and a charge amp 700. The circuit also contains four charging capacitors (690, 695, 696, and 698) and switches 610, 615, 620, 625, 630, 635, 640, 645, 650, 655, 660, 665, 670, 675, 680, and 685.

Figure 17:
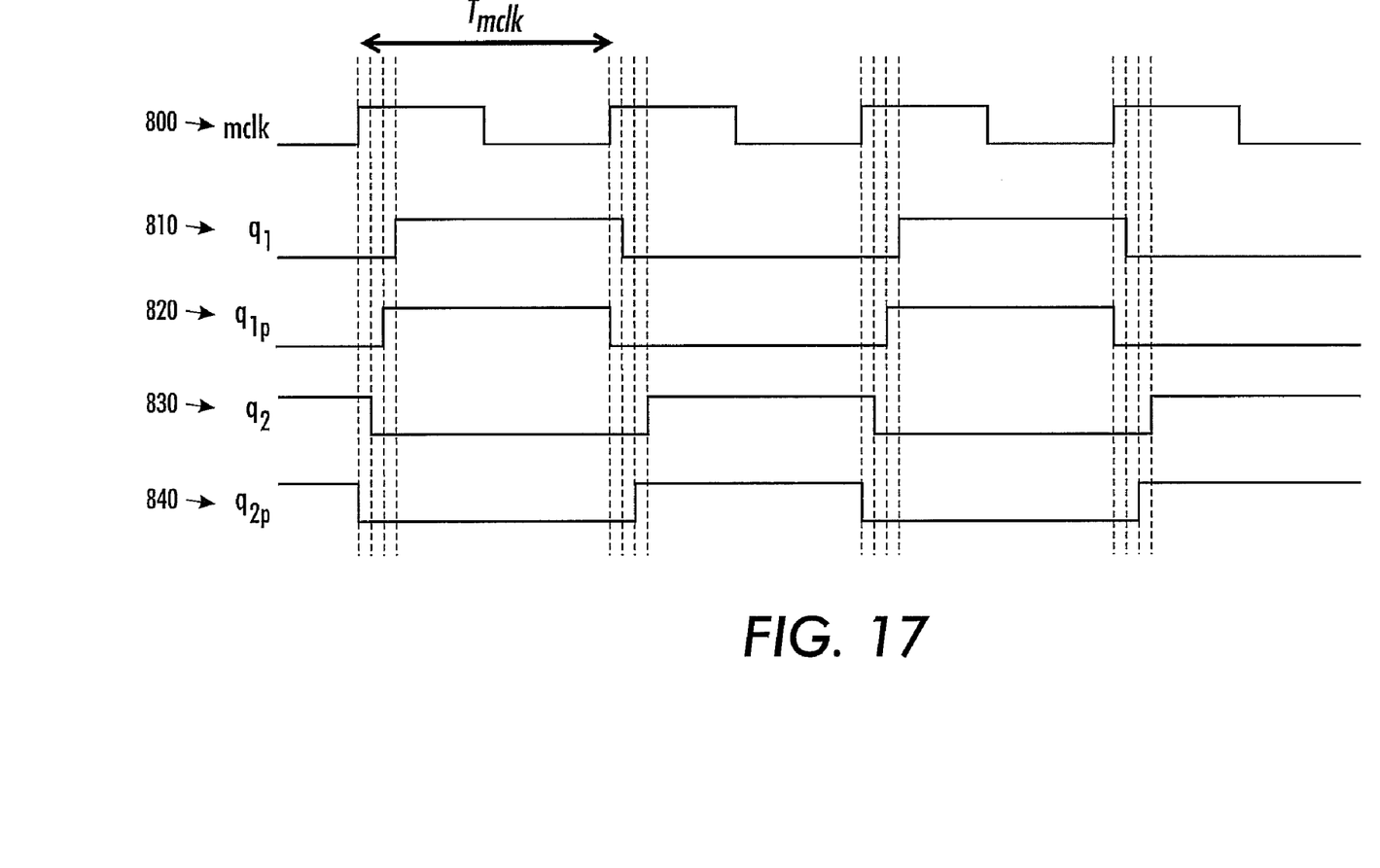
FIG. 17 illustrates the clock signals for the double-sampling flip-around sample and hold circuit of FIG. 16.

These switches are controlled by a series of clock signals shown in FIG. 17. Each clock signal has been associated with a switch of FIG. 16. It is noted that the signals that control the switches may be logical operations of one or more of the clock signals. For example, the signal controlling a switch may be a logical OR of two clock signals.

The clock signals ensure that the switches close in the proper order. Slight delays between the rising edges of the four clock signals 810, 820, 830, and 840 are chosen to ensure that the four charging capacitors (690, 695, 696, and 698) are connected to either the buffer 600 or the amplifier 700 at any given time, but not to both. It is noted that there is no interaction between the four charging capacitors (690, 695, 696, and 698). These four clock signals are all derived from the master clock signal 800.

The operation of the circuit is similar to that of the single capacitor sample and hold. At the start of the cycle, clock signals 830 and 840 are high and all other clock signals are low. When clock signal 840 goes low, switches 655, 665, 675 and 685 open. The next step in the cycle occurs when clock signal 830 goes low. At this time, switches 610, 625, 630, and 645 open. The next step in the cycle occurs when clock signal 820 goes high. At this time, switches 650, 660, 670, and 680 close. At the last step, clock signal 810 goes high. This causes switches 615, 620, 635, and 640 to close.

In the architecture of FIG. 16, the capacitors (690, 695, 696, and 698) are switched between tracking mode and hold mode, alternatively. For instance, when capacitors 695 and 696 track the buffer output, capacitors 690 and 698 are holding the previous sample at the output of the amplifier 700.

As illustrated in FIGS. 16 and 17, the amplifier (700) input nodes (A and B) are never connected to $V_{cmsha}$ directly. Therefore, the amplifier (700) input nodes (A and B) stay at a $(2V_{cmsha}-V_{cmbuf})$ voltage level during both phases of operation. If the difference between $V_{cmsha}$ and $V_{cmbuf}$ is large, the input common mode is at low voltage even at the beginning of the hold mode when the voltage jumps occur. This makes a multiple-sampling architecture more prone to have temporary negative voltage at the amplifier inputs at the start of the hold mode. Also, the amplifier (700) outputs are not shorted to $V_{cmsha}$ in FIG. 16.

Thus, the amplifier (700) outputs have to swing from the previous sample voltage to the new sample. At the sampling rates close to the Nyquist rate, the memory of the previous sample causes a larger voltage jump at the amplifier inputs since the amplifier has to travel between the two extreme voltage swing limits. A larger voltage jump increases the possibility of negative voltage happening at the amplifier inputs.

To avoid the amplifier low input common mode voltage, the sampling capacitors can be connected to $V_{cmbuf}$ instead of $V_{cmsha}$ during the tracking mode. This will maintain the amplifier input common mode voltage at $V_{cmsha}$ in both phases of operation. A higher common mode voltage at the amplifier inputs reduces the possibility of the junction forward biasing and corrupting the charge on the sampling capacitors at the start of the hold mode.

Table 1 shows resulting distortion component for the various architectures and connection modes wherein a two-tone signal was applied to the input of the buffer with the frequency of one tone being 8 MHz and the frequency of the other tone being 10 MHz, and the sampling frequency was 24 MHz. For all cases the distortion component appeared at 6 MHz. The buffer common mode output voltage was 1.3V where the sample and hold input common mode voltage was set to 1.1 V.

As can be seen from the first three rows of the table, the distortion actually became worse as one goes from a single sampling to double sampling, but when using the triple sampling architecture the improvement is 3.2 dB. The higher level of distortion in the double sampling architecture is due to the higher level of disturbance introduced at the output of the buffer.

The fourth row of Table 1 shows the further improvement to the output distortion level when the three capacitors are pre-charged to the difference between the common mode voltage and the sample and hold input common mode voltage. Row 5 of Table 1 shows the further improvement when the three capacitors are connected to the buffer output through 10 KΩ resistors. The lower the resistance, the closer the sampling capacitor is pre-charged to the buffer output, and therefore, the lower the disturbance introduced to the buffer output when the tracking mode for this capacitor starts. Row 6 shows the further improvement when the resistance is lowered to 5 KΩ.

TABLE 1

| Case No. | sample and hold Architecture | Distortion IM3 (Low Freq.) dB | Distortion Improvement (dB) |
| --- | --- | --- | --- |
| 1 | Single-Sampling | −69.2 | |
| | | | 3.2 |
| 2 | Double-Sampling | −59.5 | |
| | | | 1.5 |
| 3 | Triple-Sampling | −72.4 | 7.0 |
| | | | 1.2 |
| 4 | Triple-Sampling with discharging caps to Vcmbuf | −73.9 | |
| | | | 1.1 |
| 5 | Triple-Sampling with caps connected to the buffer outputs through 10K ohms resistors in discharge mode | −75.1 | |
| 6 | Triple-Sampling with caps connected to the buffer outputs through 5K ohms resistors in discharge mode | −76.2 | |

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A sample and hold circuit, comprising:
   a buffer to receive an input signal to be sampled;
   an amplifier to output the sampled signal;
   a first sampling capacitor operatively connected between said buffer and said amplifier;
   a second sampling capacitor operatively connected between said buffer and said amplifier;
   a third sampling capacitor operatively connected between said buffer and said amplifier;
   a first set of switches to connect said first sampling capacitor to an output of said buffer during a first cycle of a clock;
   a second set of switches to connect said second sampling capacitor to a feedback path of said amplifier during the first cycle of the clock; and
   a third set of switches to connect said third sampling capacitor to a discharge element during the first cycle of the clock.

2. The sample and hold circuit as claimed in claim 1, wherein said first set of switches connects said first sampling capacitor to the discharge element during a second cycle of the clock;
   said second set of switches connects said second sampling capacitor to the output of said buffer during the second cycle of a clock;
   said third set of switches connects said third sampling capacitor to the feedback path of said amplifier during the second cycle of the clock.

3. The sample and hold circuit as claimed in claim 2, wherein said first set of switches connects said first sampling capacitor to the feedback path of said amplifier during a third cycle of the clock;
   said second set of switches connects said second sampling capacitor to the discharge element during the third cycle of a clock;
   said third set of switches connects said third sampling capacitor to the output of said buffer during the third cycle of the clock.

4. The sample and hold circuit as claimed in claim 1, wherein said first set of switches, said second set of switches, and said third set of switches prevent said first sampling capacitor, said second sampling capacitor, said third sampling capacitor from being simultaneously connected to each other.

5. A method for sampling and holding a sample, comprising:
   (a) receiving an input signal to be sampled;
   (b) amplifying the sampled signal;
   (c) connecting a first sampling capacitor to an output of a buffer during a first cycle of a clock;
   (d) connecting the second sampling capacitor across a feedback path of an amplifier during the first cycle of a clock; and
   (e) connecting a third sampling capacitor to a discharge element during the first cycle of the clock.

6. The method as claimed in claim 5, further comprising:
   (g) preventing the first sampling capacitor and the second sampling capacitor from being simultaneously connected to each other.

7. The method as claimed in claim 5, further comprising:
   (f) connecting the first sampling capacitor to the discharge element during a second cycle of the clock;
   (g) connecting the second sampling capacitor to the output of the buffer during the second cycle of a clock; and (h) connecting the third sampling capacitor to the feedback path of the amplifier during the second cycle of the clock.
8. The method as claimed in claim 7, further comprising:
(i) connecting the first sampling capacitor to the feedback path of the amplifier during a third cycle of the clock;
(j) connecting the second sampling capacitor to the discharge element during the third cycle of a clock; and
(k) connecting the third sampling capacitor to the output of the buffer during the third cycle of the clock.
9. The method as claimed in claim 5, further comprising:
(f) preventing the first sampling capacitor, the second sampling capacitor, the third sampling capacitor from being simultaneously connected to each other.

\* \* \* \* \*